(12) United States Patent
Shibahara

(10) Patent No.: US 7,683,735 B2
(45) Date of Patent: *Mar. 23, 2010

(54) BALANCED ACOUSTIC WAVE FILTER

(75) Inventor: Teruhisa Shibahara, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 600 days.

This patent is subject to a terminal disclaimer.

(21) Appl. No.: 11/354,536

(22) Filed: Feb. 15, 2006

(65) Prior Publication Data

US 2006/0181369 A1    Aug. 17, 2006

(30) Foreign Application Priority Data

Feb. 16, 2005  (JP)  ............................. 2005-039629
Feb. 22, 2005  (JP)  ............................. 2005-045875
Mar. 4, 2005   (JP)  ............................. 2005-060468

(51) Int. Cl.
*H03H 9/00* (2006.01)
*H03H 9/64* (2006.01)
*H03H 9/68* (2006.01)

(52) U.S. Cl. ...................................... 333/133; 333/195
(58) Field of Classification Search ................. 333/195, 333/133, 193, 196
See application file for complete search history.

(56) References Cited

U.S. PATENT DOCUMENTS

| | | | | |
|---|---|---|---|---|
| 5,767,754 | A * | 6/1998 | Menna | 333/25 |
| 6,046,656 | A * | 4/2000 | Mishima | 333/141 |
| 6,771,144 | B2 * | 8/2004 | Takamine | 333/133 |
| 6,989,724 | B2 * | 1/2006 | Watanabe et al. | 333/133 |
| 7,151,424 | B2 * | 12/2006 | Kando | 333/193 |
| 7,429,905 | B2 * | 9/2008 | Shibahara | 333/193 |
| 2003/0168932 | A1 | 9/2003 | Shibata et al. | |
| 2004/0080385 | A1 | 4/2004 | Takamine et al. | |

FOREIGN PATENT DOCUMENTS

| | | |
|---|---|---|
| JP | 07-074584 | 3/1995 |
| JP | 05-218787 | 8/1995 |
| JP | 10-335974 A | 12/1998 |
| JP | 2001-029471 | 1/2001 |
| JP | 2001-185980 | 7/2001 |
| JP | 2001-292050 | 10/2001 |

(Continued)

OTHER PUBLICATIONS

Official communication issued in counterpart Japanese Application No. 2005-039629, mailed on Mar. 10, 2009.

*Primary Examiner*—Dean O Takaoka
(74) *Attorney, Agent, or Firm*—Keating & Bennett, LLP

(57) ABSTRACT

In an acoustic wave filter device, first and second surface acoustic wave filter sections implemented by longitudinally coupled resonators are arranged on a piezoelectric substrate. The first and second surface acoustic wave filter sections include first to third interdigital transducers and fourth to sixth interdigital transducers, respectively, arranged in a direction of propagation of surface waves. The first, third, fourth, and sixth interdigital transducers are connected to an unbalanced terminal. The second and fifth interdigital transducers are connected to first and second balanced terminals, respectively. Each of the second and fifth interdigital transducers has first and second interdigital transducer segments divided in the direction of propagation of acoustic waves. The first and second interdigital transducer segments are connected in series with each other.

20 Claims, 10 Drawing Sheets

FOREIGN PATENT DOCUMENTS

| | | |
|---|---|---|
| JP | 2002-290203 | 10/2002 |
| JP | 2002-300005 | 10/2002 |
| JP | 2003-289238 A | 10/2003 |
| JP | 2004-96244 A | 3/2004 |
| JP | 2004-140785 | 5/2004 |

* cited by examiner

BALANCED ACOUSTIC WAVE FILTER

BACKGROUND OF THE INVENTION

1. Field of the Invention

The present invention relates to balanced acoustic wave filter devices that use acoustic waves, such as surface acoustic waves or boundary acoustic waves. More specifically, the present invention relates to a balanced acoustic wave filter device having a balanced-to-unbalanced conversion function using a plurality of acoustic wave filter elements defined by longitudinally coupled resonators.

2. Description of the Related Art

Surface acoustic wave filters are often connected as band pass filters between antennas and differential amplifiers in mobile communication devices. In such a case, an antenna inputs and outputs unbalanced signals. On the other hand, a differential amplifier inputs and outputs balanced signals. Thus, a component having a function of unbalanced-to-balanced conversion must be disposed between the antenna and the differential amplifier. Thus, when a surface acoustic wave filter having a balanced-to-unbalanced conversion function is used as a band pass filter, the component for implementing a balanced-to-unbalanced conversion function, i.e., a balun, may be omitted. In view of this advantage, various types of balanced surface acoustic wave filters having a balanced-to-unbalanced conversion function have been proposed.

However, the characteristic impedance of an antenna is usually about 50Ω, while the characteristic impedance of a differential amplifier is usually about 100Ω or higher, and is occasionally about 1,000Ω. Thus, a surface acoustic wave filter having a balanced-to-unbalanced conversion function must also have an impedance conversion function.

Japanese Unexamined Patent Application Publication No. 2002-290203 discloses a surface acoustic wave filter device having a balanced-to-unbalanced conversion function together with an impedance conversion function.

FIG. 10 is schematic plan view showing an electrode structure of a balanced surface acoustic wave filter device disclosed in Japanese Unexamined Patent Application Publication No. 2002-290203. A surface acoustic wave filter device 501 has an unbalanced terminal 502 and first and second balanced terminals 503 and 504. The unbalanced terminal 502 is connected to first and second surface acoustic wave filters 505 and 506, each defined by longitudinally coupled resonators. The surface acoustic wave filter 505 includes first to third interdigital transducers (IDTs) 505a to 505c, and the surface acoustic wave filter 506 includes first to third IDTs 506a to 506c. That is, each of the surface acoustic wave filters 505 and 506 is a surface acoustic wave filter including three IDTs defined by longitudinally coupled resonators. On either side of the IDTs 505a to 505c in a direction of propagation of surface acoustic waves, reflectors 505d and 505e are provided. Similarly, on either side of the IDTs 506a to 506c in the direction of propagation of surface acoustic waves, reflectors 506d and 506e are provided.

The second IDTs 505b and 506b in the middle are commonly connected to the unbalanced terminal 502. The IDTs 505a and 505c on either side of the surface acoustic wave filter 505 are commonly connected to the first balanced terminal 503. The first and third IDTs 506a and 506c on either side of the surface acoustic wave filter 506 are commonly connected to the second balanced terminal 504. The phases of the first and second surface acoustic wave filters 505 and 506 differ by 180 degrees.

In the surface acoustic wave filter device 501 disclosed in Japanese Unexamined Patent Application Publication No. 2002-290203, the direction of propagation of acoustic waves is the same in the first and second surface acoustic wave filters 505 and 506. Furthermore, a gap $d_1$ between the first and second surface acoustic wave filters 505 and 506 and a thickness t of a piezoelectric substrate satisfy $d_1 \leq 2.3 \times t$ or $d_1 \geq 2.8 \times t$. The disclosure of Japanese Unexamined Patent Application Publication No. 2002-290203 describes that these features improve transmission characteristics.

Furthermore, in the surface acoustic wave filter device 501, the input impedance of each of the surface acoustic wave filters 505 and 506 is denoted by Z, and the impedance at the unbalanced terminal 502 is approximately Z/2 since the impedance corresponds to an impedance of a parallel connection of the input impedances of the surface acoustic wave filters 505 and 506. The impedance at each of the balanced terminals 503 and 504 is approximately 2Z since the impedance corresponds to an impedance of a series connection of the impedances of the surface acoustic wave filters 505 and 506. Thus, the ratio of the impedance at the unbalanced terminal 502 to the impedance at the balanced terminals 503 and 504 can be chosen to be approximately 1:4.

As described above, in the surface acoustic wave filter device 501, the ratio of the impedance on the side of the unbalanced terminal 502 to the impedance on the side of the balanced terminals 503 and 504 is chosen to be approximately 1:4.

Thus, for example, the surface acoustic wave filter device 501 described above can be used suitably when the input/output impedance of an antenna is approximately 50Ω and the characteristic impedance of a differential amplifier connected at a subsequent stage of the surface acoustic wave filter device is approximately 200Ω.

Recently, however, the characteristic impedance of a differential amplifier used in such an application is typically greater than about 200Ω, and is occasionally about 1,000Ω.

Thus, even when the surface acoustic wave filter device 501 disclosed in Japanese Unexamined Patent Application Publication No. 2002-290203 is used, when a differential amplifier having such a large impedance is connected to a subsequent stage thereof, an additional impedance conversion component must be provided. That is, the surface acoustic wave filter device 501 disclosed in Japanese Unexamined Patent Application Publication No. 2002-290203 does not provide a sufficient a sufficient impedance conversion function. Thus, a demand exists for a balanced surface acoustic wave filter device in which the input/output impedance ratio can be further increased.

Also recently, in addition to surface acoustic waves, acoustic wave filter devices that use other types of acoustic waves, such as boundary acoustic waves, are available. In a boundary acoustic wave filter, IDTs are provided at a boundary of lamination of a piezoelectric substrate and a dielectric layer to utilize boundary acoustic waves that propagate at the boundary. A boundary acoustic wave filter can be implemented by arranging electrodes substantially in the same manner as in a surface acoustic wave filter. Also, in boundary acoustic wave filter devices, it is also desirable to have both a balanced-to-unbalanced conversion function and a function of converting impedance by a large ratio.

SUMMARY OF THE INVENTION

In order to overcome the problems described above, preferred embodiments of the present invention provide an acoustic wave filter device having a balanced-to-unbalanced conversion function and also having an impedance conversion function between an impedance on the side of an unbalanced terminal and an impedance on the side of balanced terminals by a further increased ratio.

According to a first preferred embodiment of the present invention, a balanced acoustic wave filter device is provided which includes an unbalanced terminal and first and second balanced terminals. The balanced acoustic wave filter device includes a piezoelectric substrate, first and second acoustic wave filter sections arranged on the piezoelectric substrate, wherein the first and second acoustic wave filter sections each include at least three IDTs defined by longitudinally coupled resonators. The first acoustic wave filter section includes a first IDT, a second IDT, and a third IDT; the second IDT being connected to the first balanced terminal, and the first and third IDTs being disposed on either side of the second IDT in a direction of propagation of acoustic waves and connected to the unbalanced terminal. The second acoustic wave filter section includes a fourth IDT, a fifth IDT, and a sixth IDT; the fifth IDT being connected to the second balanced terminal and the fourth and sixth IDTs being disposed on either side of the fifth IDT in the direction of propagation of acoustic waves and connected to the unbalanced terminal. The first to sixth IDTs are arranged such that an electric signal that flows through the first balanced terminal and an electric signal that flows through the second balanced terminal have phases that are different by 180 degrees. The second IDT of the first acoustic wave filter section and the fifth IDT of the second acoustic wave filter section each have first and second IDT bus bar segments divided in the direction of propagation of acoustic waves, the first and second IDT segments being electrically connected in series with each other.

In a specific example of the first preferred embodiment, outermost electrode fingers on either side of the second IDT in the direction of propagation of acoustic waves are connected to a portion interconnecting the first and second IDT segments in series in the second IDT, and outermost electrode fingers on either side of the fifth IDT in the direction of propagation of acoustic waves are connected to a portion interconnecting the first and second IDT segments in series in the fifth IDT.

According to a second preferred embodiment of the present invention, a balanced acoustic wave filter device is provided which includes an unbalanced terminal and first and second balanced terminals. The balanced acoustic wave filter device includes a piezoelectric substrate, first and second acoustic wave filter sections arranged on the piezoelectric substrate, wherein the first and second acoustic wave filter sections each include at least three IDTs defined by longitudinally coupled resonators. The first acoustic wave filter section includes first to third IDTs disposed along a direction of propagation of acoustic waves, and the second acoustic wave filter section includes fourth to sixth IDTs disposed along the direction of propagation of acoustic waves. The first to sixth IDTs are arranged such that a phase difference of an output signal relative to an input signal in the first acoustic wave filter section and a phase difference of an output signal relative to an input signal in the second acoustic wave filter section differ by 180 degrees. The second and fifth IDTs are connected to the unbalanced terminal. The first and third IDTs of the first acoustic wave filter section are electrically connected in series with each other and are connected to the first balanced terminal. The fourth and sixth IDTs of the second acoustic wave filter section are electrically connected in series with each other and are connected to the second balanced terminal.

In a specific example of the second preferred embodiment, outermost electrode fingers of the second and fifth IDTs connected to the unbalanced terminal are connected to a ground potential.

In another specific example of the second preferred embodiment, series weighting is applied to a plurality of electrode fingers including outermost electrode fingers adjacent to the outermost electrode finger of the second or fifth IDT in at least one of the first, third, fourth, and sixth IDTs.

According to a third preferred embodiment of the present invention, a balanced acoustic wave filter device is provided. The balanced acoustic wave filter device includes a first filter element defined by longitudinally coupled resonators, a second filter element defined by longitudinally coupled resonators, a phase difference of an output signal relative to an input signal in the second filter element differing by 180 degrees from a phase difference of an output signal relative to an input signal in the first filter element, a third filter element defined by longitudinally coupled resonators, and a fourth filter element defined by longitudinally coupled resonators, a phase difference of an output signal relative to an input signal in the fourth filter element differing by 180 degrees from a phase difference of an output signal relative to an input signal in the third filter element. The first to fourth filter elements are connected to an unbalanced terminal, and IDTs connected to the unbalanced terminal among IDTs of the first to fourth filter elements are connected in parallel. The third filter element is connected to a first balanced terminal and the fourth filter element is connected to a second balanced terminal. An IDT connected to the first balanced terminal among the IDTs of the third filter element is connected in series with a corresponding IDT of the first filter element. An IDT connected to the second balanced terminal among the IDTs of the fourth filter element is connected in series with a corresponding IDT in the second filter element.

Preferably, the third and fourth filter elements are configured substantially the same as the first and second filter elements, respectively. "Configured substantially the same" refers to, for example, configurations that are different only regarding whether weighting is applied, such as series weighting that will be described later.

In a specific example of the third preferred embodiment, electrode fingers that are adjacent to IDTs connected to the first or second balanced terminal among electrode fingers of the IDTs connected to the unbalanced terminal are connected to a ground potential.

In another specific example of the third preferred embodiment, series weighting is applied to at least some electrode fingers that are adjacent to the IDTs connected to the unbalanced terminal and that are not connected to the ground potential among electrode fingers of the IDTs connected to the first or second balanced terminal.

In another specific example of any one of the first to third preferred embodiments, the balanced acoustic wave filter device is a surface acoustic wave filter device that uses surface acoustic waves as acoustic waves.

In another specific example of any one of the first to third preferred embodiments, the balanced acoustic wave filter device is a boundary acoustic wave filter device that uses boundary acoustic waves as acoustic waves.

The balanced acoustic wave filter device according to the first preferred embodiment includes first and second acoustic wave filter sections defined by longitudinally coupled resonators. In the first acoustic wave filter section, the second IDT is connected to the first balanced terminal, and the first and third IDTs are connected to the unbalanced terminal. In the second acoustic wave filter section, the fifth IDT is connected to the second balanced terminal, and the fourth and sixth IDTs are connected to the unbalanced terminal. The first to sixth IDTs are arranged so that an electric signal that flows through the first balanced terminal and an electric signal that flows through the second balanced terminal have phases that are different by 180 degrees. Thus, the balanced acoustic wave filter device has a balanced-to-unbalanced conversion function.

Furthermore, the second IDT of the first acoustic wave filter section and the fifth IDT of the second acoustic wave filter section each have first and second IDT segments divided in the direction of propagation of acoustic waves, the first and second IDT segments being electrically connected in series with each other. Thus, the ratio of the impedance on the side of the unbalanced terminal to the impedance on the side of the balanced terminals is approximately 1:16.

When the first and second acoustic filter sections are arranged such that the second and fifth IDTs of the first and second acoustic wave filter sections are connected to the first and second balanced terminal and the first and third IDTs and the fourth and sixth IDTs are connected to the unbalanced terminal, similar to the arrangement disclosed in Japanese Unexamined Patent Application Publication No. 2002-290203, the ratio of the impedance on the side of the unbalanced terminal to the impedance on the side of the balanced terminals is approximately 1:4.

In the first preferred embodiment, the second IDT and fifth IDTs each have first and second IDT segments divided in the direction of propagation of acoustic waves, and the first and second IDT segments are electrically connected in series with each other. Thus, the impedance on the side of the balanced terminals can be quadrupled as compared to the case of the surface acoustic wave filter device disclosed in Japanese Unexamined Patent Application Publication No. 2002-290203. Therefore, according to the first preferred embodiment, the ratio of the impedance on the side of the unbalanced terminal to the impedance on the side of the balanced terminals is approximately 1:16. Accordingly, the acoustic wave filter device has a balanced-to-unbalanced conversion function, and also has an impedance conversion function with a large ratio.

In the first preferred embodiment, when outermost electrode fingers on either side of the second IDT in the direction of propagation of acoustic waves are connected to a portion interconnecting the first and second IDT segments in series in the second IDT, and outermost electrode fingers on either side of the fifth IDT in the direction of propagation of acoustic waves are connected to a portion interconnecting the first and second IDT segments in series in the fifth IDT, the outermost electrode fingers of the second and fifth IDTs adjacent to the first and third IDTs or the fourth and sixth IDTS, i.e., the IDTs connected to the first or second balanced terminal, are connected to the portions of series interconnection. Thus, in a region where the second or fifth IDT is adjacent to the first and third IDTs or the fourth and sixth IDTS, an electrode finger to which a balanced signal is applied is not adjacent to an electrode finger to which an unbalanced signal is applied. This increases out-of-band attenuation and improves balance.

The balanced acoustic wave filter device according to the second preferred embodiment includes the first and second acoustic wave filter sections defined by longitudinally coupled resonators. The first to sixth IDTs are arranged so that a phase difference of an output signal relative to an input signal in the first acoustic wave filter section and a phase difference of an output signal relative to an input signal in the second acoustic wave filter section are different by 180 degrees. The second and fifth IDTs are connected to the unbalanced terminal. The first and third IDTs of the first acoustic wave filter section are connected to the first balanced terminal. The fourth and sixth IDTs of the second acoustic wave filter section are connected to the second balanced terminal. Thus, the balanced acoustic wave filter device has a balanced-to-unbalanced conversion function.

Furthermore, according to the second preferred embodiment, the first and third IDTs are electrically connected in series with each other, and the fourth and sixth IDTs are electrically connected in series with each other. Thus, the ratio of the impedance on the side of the unbalanced terminal to the impedance on the side of the balanced terminals is approximately 1:16.

When the first and second acoustic wave filter sections are connected in parallel to the unbalanced terminal, the first acoustic wave filter section is connected to the first balanced terminal, and the second acoustic wave filter section is connected to the second balanced terminal, the ratio of the impedance on the side of the unbalanced terminal to the impedance on the side of the balanced terminals is approximately 1:4. Furthermore, according to the second preferred embodiment, the first and third IDTs are electrically connected in series with each other, and the fourth and sixth IDTs are electrically connected in series with each other. Therefore, according to the second preferred embodiment, the ratio of the impedance on the side of the unbalanced terminal to the impedance on the side of the balanced terminals is approximately 1:16.

Accordingly, the acoustic wave filter device has a balanced-to-unbalanced conversion function, and also has an impedance conversion function with a large ratio.

When outermost electrode fingers of the second and fifth IDTs connected to the unbalanced terminal are connected to a ground potential, in a region where the second or fifth IDT is adjacent to the first and third IDTs or the fourth and sixth IDTS, electrode fingers connected to signal terminals are not adjacent to each other. That is, an electrode finger to which a balanced signal is applied is not adjacent to an electrode finger to which an unbalanced signal is applied. This increases out-of-band attenuation and improves balance.

When series weighting is applied to a plurality of electrode fingers including outermost electrode fingers adjacent to the outermost electrode finger of the second or fifth IDT in at least one of the first, third, fourth, and sixth IDTs, balance is further improved.

The balanced acoustic wave filter device according to the third preferred embodiment includes the first to fourth filter elements each defined by longitudinally coupled resonators. A phase difference of an output signal relative to an input signal in the first filter element differs by 180 degrees from a phase difference of an output signal relative to an input signal in the second filter element. A phase difference of an output signal relative to an input signal in the third filter element differs by 180 degrees from a phase difference of an output signal relative to an input signal in the fourth filter element. The first to fourth filter elements are connected to the unbalanced terminal. The first and third filter elements are connected to each other, and the third filter element is connected to the first balanced terminal. The second and fourth filter elements are connected to each other, and the fourth filter element is connected to the second balanced terminal. Thus, the balanced acoustic wave filter device has a balanced-to-unbalanced conversion function.

Furthermore, IDTs of the first to fourth filter elements connected to the unbalanced terminal are connected in parallel. An IDT of the third filter element connected to the first balanced terminal is connected in series with a corresponding IDT of the first filter element. An IDT of the fourth filter element connected to the second balanced terminal is connected in series with a corresponding IDT in the second filter element. Thus, the ratio of the impedance on the side of the unbalanced terminal to the impedance on the side of the balanced terminals is approximately 1:16. Accordingly, the acoustic wave filter device has a balanced-to-unbalanced conversion function, and also has an impedance conversion function with a large ratio.

When electrode fingers that are adjacent to IDTs connected to the first or second balanced terminal among electrode fingers of the IDTs connected to the unbalanced terminal are connected to a ground potential, the out-of-band attenuation is increased, and the balance of signals output from the balanced terminals is improved.

When series weighting is applied to at least some electrode fingers that are adjacent to the IDTs connected to the unbalanced terminal and that are not connected to the ground potential among electrode fingers of the IDTs connected to the first or second balanced terminal, the balance is further improved.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will now be described with reference to the drawings.

Figure 1:
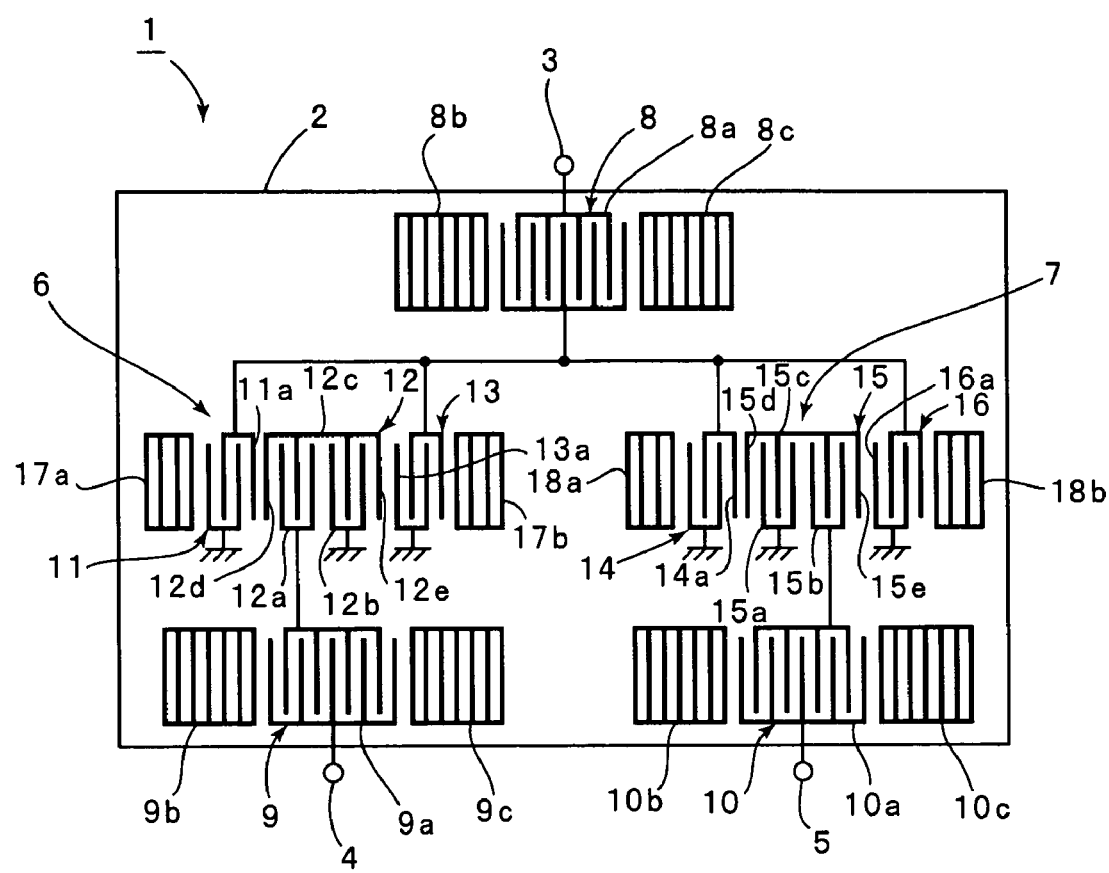
FIG. 1 is a schematic plan view of a surface acoustic wave filter device according to a preferred embodiment of the present invention.

FIG. 1 is a schematic plan view of a surface acoustic wave filter device according to a preferred embodiment of the present invention. This preferred embodiment relates to a surface acoustic wave filter device having a first surface acoustic wave filter section and a second surface acoustic wave filter section each including three IDTs defined by longitudinally coupled resonators.

A surface acoustic wave filter device 1 includes a piezoelectric substrate 2. The piezoelectric substrate 2 is composed of a piezoelectric monocrystalline material, such as $LiTaO_3$, $LiNbO_3$, quartz, or a piezoelectric ceramic material. The piezoelectric substrate 2 may be constructed by forming a piezoelectric thin film on a base composed of a piezoelectric material or on an insulating base.

The surface acoustic wave filter device 1 according to this preferred embodiment is a balanced surface acoustic wave filter device having a balanced-to-unbalanced conversion function. The surface acoustic wave filter device 1 has an unbalanced terminal 3 and first and second balanced terminals 4 and 5.

On the piezoelectric substrate 2, first and second surface acoustic wave filter sections 6 and 7 each including three IDTs defined by longitudinally coupled resonators are provided.

In the first surface acoustic wave filter section 6, first to third IDTs 11 to 13 are disposed along a direction of propagation of surface acoustic waves. Similarly, in the second surface acoustic wave filter section 7, fourth to sixth IDTs 14 to 16 are disposed along a direction of propagation of surface acoustic waves.

In the first surface acoustic wave filter section 6, reflectors 17a and 17b are disposed on either side of a region where the first to third IDTs 11 to 13 are provided in the direction of propagation of surface acoustic waves. Similarly, in the second surface acoustic wave filter section 7, reflectors 18a and 18b are disposed on either side of a region where the fourth to sixth IDTs 14 to 16 are provided in the direction of propagation of surface acoustic waves.

In the first surface acoustic wave filter section 6, one end of the first IDT 11 and one end of the third IDT 13 disposed on either side of the second IDT 12 in the middle are commonly connected to the unbalanced terminal 3 via a one-port surface acoustic wave resonator 8. Similarly, in the second surface acoustic wave filter section 7, one end of the fourth IDT 14 and one end of the sixth IDT 16 disposed on either side of the fifth IDT 15 in the middle are commonly connected to the unbalanced terminal 3 via the surface acoustic wave resonator 8.

The surface acoustic wave resonator 8 includes an IDT 8a, and reflectors 8b and 8c disposed on either side of the IDT 8a in the direction of propagation of surface acoustic waves.

The second IDT 12 in the middle of the first surface acoustic wave filter section 6 includes one bus bar divided into first and second IDT bus bar segments 12a and 12b. The first and second IDT segments 12a and 12b are disposed along the direction of propagation of surface acoustic waves. That is, the first and second IDT segments 12a and 12b are provided by dividing the IDT 12 in the direction of propagation of surface acoustic waves.

The first and second IDT segments 12a and 12b are connected in series with each other via a bus bar 12c. The first IDT segment 12a is disposed on the side of the first IDT 11, and is connected to the first balanced terminal 4 via a one-port surface acoustic wave resonator 9.

The surface acoustic wave resonator 9 includes an IDT 9a, and reflectors 9b and 9c disposed on either side of the IDT 9a in the direction of propagation of surface acoustic waves.

Similarly, the fifth IDT 15 in the middle of the second surface acoustic wave filter section 7 includes first and second IDT bus bar segments 15a and 15b divided in the direction of propagation of surface acoustic waves. The first and second IDT segments 15a and 15b are connected in series with each other via a bus bar 15c.

The second IDT segment 15b is connected to the second balanced terminal 5 via a one-port surface acoustic wave resonator 10. The surface acoustic wave resonator 10 includes an IDT 10a, and reflectors 10b and 10c disposed on either side of the IDT 10a in the direction of propagation of surface acoustic waves.

In this preferred embodiment, the first to sixth IDTs 11 to 16 are arranged so that the phases of signals output from the first and second balanced terminals 4 and 5 differ by 180 degrees.

Furthermore, in the surface acoustic wave filter device 1 according to this preferred embodiment, the first and third IDTs 11 and 13 and the fourth and sixth IDTs 14 and 16 of the first and second surface acoustic wave filter sections 6 and 7 are connected to the unbalanced terminal 3, and the second and fifth IDTs 12 and 15 in the middle are respectively connected to the first and second balanced terminals 4 and 5, so as to quadruple the impedance ratio. Furthermore, since the second and fifth IDTs 12 and 15 are configured as described above, the impedance ratio of the unbalanced terminal 3 to the balanced terminals 4 and 5 is approximately 1:16.

More specifically, the second IDT 12 includes the first and second IDT segments 12a and 12b, and the fifth IDT 15 includes the first and second IDT segments 15a and 15b. Furthermore, the first and second IDT segments 12a and 12b are electrically connected in series with each other, and the first and second IDT segments 15a and 15b are electrically connected in series with each other. Thus, the values of characteristic impedances of the second and fifth IDTs 12 and 15 are approximately quadrupled as compared to a case in which the first and second IDTs 12a and 12b and the first and second IDTs 15a and 15b are absent. Accordingly, in this preferred embodiment, the impedance ratio of the unbalanced terminal 3 to the first and second balanced terminals 4 and 5 can be chosen to be as large as approximately 1:16.

Furthermore, according to this preferred embodiment, outermost electrode fingers 12d and 12e of the second IDT 12 on either side thereof in the direction of propagation of surface acoustic waves are connected to the bus bar 12c. That is, the outermost electrode fingers 12d and 12e are connected to a portion interconnecting the first and second IDT segments 12a and 12b in series.

Thus, in a region where the first IDT 11 and the second IDT 12 are adjacent to each other, the electrode finger 12d is adjacent to the first IDT 11, and the electrode finger 12d is not an electrode finger to which a balanced signal that flows through the first balanced terminal 4 is applied. That is, although an unbalanced signal is applied to the outermost electrode finger 11a of the first IDT 11 on the side of the second IDT 12, a balanced signal is not applied to the outermost electrode finger 12d of the second IDT 12 on the side of the first IDT 11. Thus, in the region where the first and second IDTs 11 and 12 are adjacent to each other, an electrode finger to which a balanced signal is applied is not adjacent to an electrode finger to which an unbalanced signal is applied.

When an electrode finger through which a balanced signal flows is adjacent to an electrode finger through which an unbalanced signal flows, a direct wave occurs by electromagnetic coupling between these electrode fingers. This could cause a reduction in the out-of-band attenuation or a degradation in the balance of balanced signals. In contrast, in the region where the first and second IDTs 11 and 12 are adjacent to each other, as described above, an electrode finger to which a balanced signal is applied is not adjacent to an electrode finger to which an unbalanced signal is applied, such that the out-of-band attenuation is increased and the balance is improved.

Similarly, in a region where an outermost electrode finger 12e of the second IDT 12 on the side of the third IDT 13 and an outermost electrode finger 13a of the third IDT 13 on the side of the second IDT 12 are adjacent to each other, an electrode finger to which a balanced signal is applied is not adjacent to an electrode finger to which an unbalanced signal is applied.

Also, in the second surface acoustic wave filter section 7, outermost electrode fingers 15d and 15e of the fifth IDT 15 on either side thereof in the direction of propagation of surface acoustic waves are connected to a bus bar 15c interconnecting the first and second IDT segments 15a and 15b in series. Thus, an electrode finger to which a balanced signal is applied is not adjacent to an electrode finger to which an unbalanced signal is applied in a region where the outermost electrode finger 15d of the fifth IDT 15 and an outermost electrode finger 14a of the fourth IDT 14 on the side of the fifth IDT 15 are adjacent to each other or in a region where the outermost electrode finger 15e of the fifth IDT 15 and an outermost electrode finger 16a of the sixth IDT 16 on the side of the fifth IDT 15 are adjacent to each other. Thus, the out-of-band attenuation is increased and the balance is improved.

Figure 2:
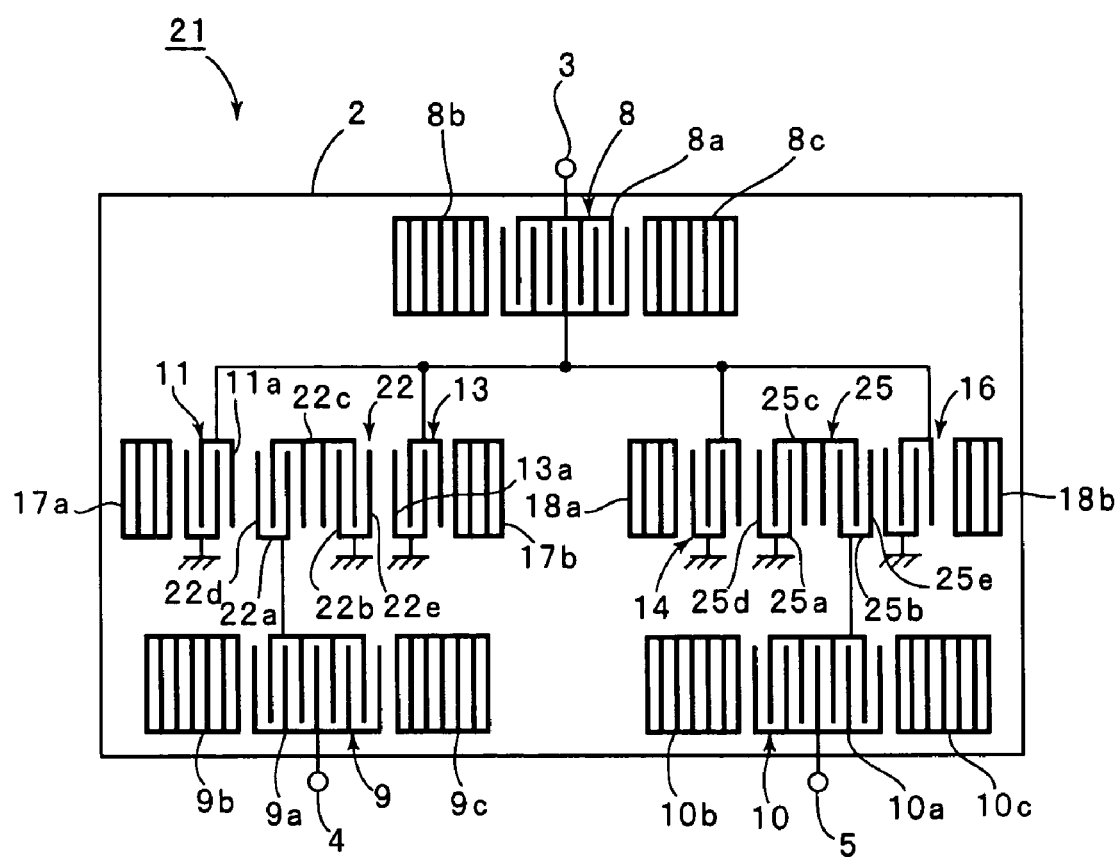
FIG. 2 is a schematic plan view of a surface acoustic wave filter device according to a modification of the preferred embodiment shown in FIG. 1.

The outermost electrode fingers 12d and 12e of the second IDT 12 and the outermost electrode fingers 15d and 15e of the fifth IDT 15 need not necessarily be electrically connected to the portion interconnecting the first and second IDT segments 12a and 12b and the portion interconnecting the first and second IDT segments 15a and 15b, respectively. FIG. 2 is a schematic plan view of such a modification.

In a surface acoustic wave filter device 21 according to the modification shown in FIG. 2, a second IDT 22 includes first and second IDT segments 22a and 22b, and a fifth IDT 25 includes first and second IDT segments 25a and 25b. Outermost electrode fingers 22d and 22e of the second IDT 22 in the direction of propagation of surface acoustic waves are not connected to a bus bar 22c interconnecting the first and second IDT segments 22a and 22b in series. Similarly, outermost electrode fingers 25e and 25d of the fifth IDT 25 in the direction of propagation of surface acoustic waves are not connected to a bus bar 25c interconnecting the first and second IDT segments 25a and 25b in series.

The surface acoustic wave filter device 21 shown in FIG. 2 is configured the same as the surface acoustic wave filter device 1 according to the preferred embodiment described earlier except that the second and fifth IDTs 22 and 25 are configured as described above. Thus, the same parts are designated by the same reference numerals, and descriptions thereof will be omitted.

To the electrode finger 22d, a signal applied to the first balanced terminal 4 is applied. In this case, a direct wave could arise between the first and second IDTs 11 and 22. However, also in this modification, the ratio of the impedance on the side of the unbalanced terminal 3 and the impedance on the side of the balanced terminals 4 and 5 can be chosen to be as large as approximately 1:16. Thus, the surface acoustic wave filter device 21 exhibits a large factor impedance conversion.

Furthermore, although IDTs are connected to the unbalanced terminal 3 and the balanced terminals 4 and 5 via one-port surface acoustic wave resonators as appropriate in the preferred embodiment and modification described above, one-port surface acoustic wave resonators need not necessarily be provided.

Figure 3:
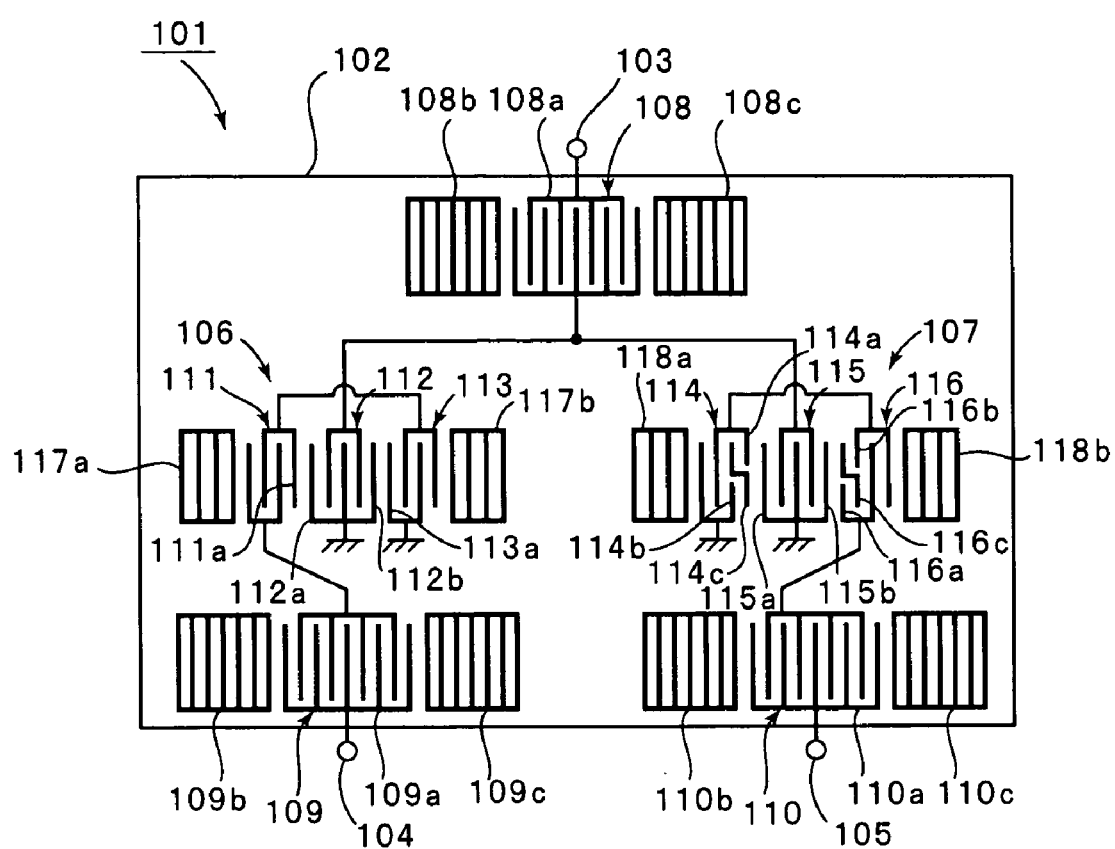
FIG. 3 is a schematic plan view of a surface acoustic wave filter device according to another preferred embodiment of the present invention.

FIG. 3 is a schematic plan view of a surface acoustic wave filter device according to another preferred embodiment of the present invention. In the surface acoustic wave filter device according to this preferred embodiment, first and second surface acoustic wave filter sections each include three IDTs defined by longitudinally coupled resonators.

A surface acoustic wave filter device 101 includes a piezoelectric substrate 102. The piezoelectric substrate 102 is composed of a piezoelectric monocrystal material, such as LiTaO$_3$, LiNbO$_3$, quartz, or a piezoelectric ceramic material. The piezoelectric substrate 2 may be constructed by forming a piezoelectric thin film on a piezoelectric base or an insulating base.

The surface acoustic wave filter device 101 according to this preferred embodiment is a balanced surface acoustic wave filter device having a balanced-to-unbalanced conversion function. The surface acoustic wave filter device 101 has an unbalanced terminal 103 and first and second balanced terminals 104 and 105.

On the piezoelectric substrate 102, first and second surface acoustic wave filter sections 106 and 107 are provided. Each of the first and second surface acoustic wave filter sections 106 and 107 include three IDTs defined by longitudinally coupled resonators.

In the first surface acoustic wave filter section 106, first to third IDTs 111 to 113 are disposed along a direction of propagation of surface acoustic waves. Similarly, in the second surface acoustic wave filter section 107, fourth to sixth IDTs 114 to 116 are disposed along the direction of propagation of surface acoustic waves.

In the first surface acoustic wave filter section 106, reflectors 117a and 117b are provided on either side of a region where the first to third IDTs 111 to 113 are provided in the direction of propagation of surface acoustic waves. Similarly, in the second surface acoustic wave filter section 107, reflectors 118a and 118b are provided on either side of a region where the fourth to sixth IDTs 114 to 116 are provided in the direction of propagation of surface acoustic waves.

One end of the second IDT 112 in the middle of the first surface acoustic wave filter section 106 and one end of the fifth IDT 115 in the middle of the second surface acoustic wave filter section 107 are commonly connected to the unbalanced terminal 103 via a one-port surface acoustic wave resonator 108.

The surface acoustic wave resonator 108 includes an IDT 108a, and reflectors 108b and 108c disposed on either side of the IDT 108 in the direction of propagation of surface acoustic waves.

The other end of the second IDT 112 and the other end of the fifth IDT 115 are connected to a ground potential. In this preferred embodiment, outermost electrode fingers 112a and 112b of the second IDT 112 in the direction of propagation of surface acoustic waves and outermost electrode fingers 115a and 115b of the fifth IDT 115 in the direction of propagation of surface acoustic waves are connected to the ground potential.

In the first surface acoustic wave filter section 106, one end of the first IDT 111 and one end of the third IDT 113 are connected to each other so that the first and third IDTs 111 and 113 are connected in series with each other. The other end of the IDT 111 is connected to the first balanced terminal 104 via a one-port surface acoustic wave resonator 109. The other end of the IDT 113 is connected to the ground potential. The surface acoustic wave resonator 109 includes an IDT 109a, and reflectors 109b and 109c disposed on either side of the IDT 109a in the direction of propagation of surface acoustic waves.

The surface acoustic wave resonators 108 and 109 are not necessarily needed.

In the second surface acoustic wave filter section 107, one end of the fourth IDT 114 and one end of the sixth IDT 116 are electrically connected to each other so that the fourth and sixth IDTs 114 and 116 are electrically connected in series with each other. In this preferred embodiment, the other end of the fourth IDT 114 is connected to the ground potential, and the other end of the sixth IDT 116 is connected to the second balanced terminal 105 via a one-port surface acoustic wave resonator 110. The surface acoustic wave resonator 110 includes an IDT 110a, and reflectors 110b and 110c disposed on either side of the IDT 110a in the direction of propagation of surface acoustic waves.

In this preferred embodiment, the first to sixth IDTs 111 to 116 are arranged so that a phase difference of an output signal relative to an input signal of the first surface acoustic wave filter section 106 and a phase difference of an output signal relative to an input signal of the surface acoustic wave filter device 107 differ by 180 degrees. More specifically, the polarity of the IDT 111 connected to the first balanced terminal 104 and the polarity of the IDT 116 connected to the second balanced terminal 105 differ by 180 degrees such that a balanced-to-unbalanced conversion function is provided.

Furthermore, in this preferred embodiment, one end of the first surface acoustic wave filter section 106 and one end of the second surface acoustic wave filter section 107 are connected to the unbalanced terminal 103; the other end of the first surface acoustic wave filter section 106 is connected to the first balanced terminal 104, and the other end of the second surface acoustic wave filter section 107 is connected to the second balanced terminal 105. Furthermore, the first and third IDTs 111 and 113 are connected in series with each other, and the fourth and sixth IDTs 114 and 116 are connected in series with each other. Thus, the ratio of the impedance on the side of the unbalanced terminal 103 to the impedance on the side of the balanced terminals 104 and 105 can be chosen to be as large as approximately 1:16.

That is, since the first and third IDTs 111 and 113 are electrically connected in series with each other and the fourth and sixth IDTs 114 and 116 are electrically connected in series with each other, compared with a case where the series connections are absent, i.e., where the first and third IDTs 111 and 113 are connected in parallel to the first balanced terminal 104 and the fourth and sixth IDTs 114 and 116 are connected in parallel to the second balanced terminal 105, the characteristic impedances of the first and third IDTs 111 and 113 and the fourth and sixth IDTs 114 and 116 is quadrupled. Thus, according to this preferred embodiment, the ratio of the impedance on the side of the unbalanced terminal 103 to the impedance on the side of the first and second balanced terminals 104 and 105 can be chosen to be as large as approximately 1:16.

Furthermore, in this preferred embodiment, the outermost electrode fingers 112a and 112b of the second IDT 112 and the outermost electrode fingers 115a and 115b of the fifth IDT 115 are connected to the ground potential. Thus, the electrode fingers of the second and fifth IDTs 112 and 115 connected to the unbalanced terminal 103 are not directly adjacent, via IDT gaps, with the electrode fingers of the first, third, fourth, and sixth IDTs 111, 113, 114, and 116 connected to the balanced terminal 104 or 105. Thus, an electrode finger to which a balanced signal is applied is not adjacent to an electrode finger to which an unbalanced signal is applied in a gap between IDTs.

When an electrode finger through which a balanced signal flows is adjacent to an electrode finger through which an unbalanced signal flows at a gap between IDTs, a direct wave could occur due to electromagnetic coupling between these electrode fingers, and this could cause reduction in out-of-band attenuation or deterioration of the balance of balanced signals. In contrast, according to this preferred embodiment, an electrode finger to which a balanced signal is applied is not adjacent to an electrode finger to which an unbalanced signal is applied at a gap between adjacent IDTs. This increases out-of-band attenuation and improves balance.

Furthermore, according to this preferred embodiment, series weighting is applied to a plurality of electrode fingers including the outermost electrode fingers of the fourth and sixth IDTs 114 and 116 on the side of the fifth IDT 115 in the second surface acoustic wave filter section 107. More specifically, series weighting is applied such that a floating electrode finger 114c is provided between the outermost electrode finger 114a of the fourth IDT 114 on the side of the fifth IDT 115 and the next electrode finger 114b. Also in the IDT 116, series weighting is applied such that a floating electrode 116c is provided between the outermost electrode finger 116a on the side of the IDT 115 and the next electrode finger 116b. The series weighting minimizes excitation of surface acoustic waves between the IDTs 114 and 115 and between the IDTs 115 and 116, such that the state of excitation of surface acoustic waves is similar to that between the IDTs 111 and 112 and the IDTs 112 and 113 on the side of the first surface acoustic wave filter section 106. This effectively improves balance.

More specifically, regarding the second surface acoustic wave filter section 107, in the region where the fourth and fifth IDTs 114 and 115 are adjacent to each other, the outermost electrode finger 114 of the fourth IDT 114 receives a balanced signal, and the outermost electrode finger 115a of the IDT 115 on the side of the IDT 114 is connected to the ground potential. Thus, surface acoustic waves are excited in the region where the IDTs 114 and 115 are adjacent to each other. Similarly, between the IDTs 115 and 116, the electrode finger 115b connected to the ground potential is adjacent to the electrode finger 116a that receives a balanced signal, so that surface acoustic waves are excited.

In contrast, in the first surface acoustic wave filter section 106, between the IDTs 112 and 113, the outermost electrodes 112b and 113a are both connected to the ground potential, so that surface acoustic waves are not excited. On the other hand, between the IDTs 111 and 112, the outermost electrode finger 111a of the IDT 111 receives a balanced signal, and the electrode finger 112a is connected to the ground potential, so that surface acoustic waves are excited.

However, according to this preferred embodiment, as described above, excitation of surface acoustic waves is minimized between the fourth and fifth IDTs 114 and 115 and between the fifth and sixth IDTs 115 and 116. Thus, the state of excitation of surface acoustic waves in IDT gaps in the second surface acoustic wave filter section 107 is similar to the state of total excitation of surface acoustic waves in the gap between the first and second IDTs 111 and 112 and the gap between the second and third IDTs 112 and 113 in the first surface acoustic wave filter section 106. Thus, balance is improved.

The arrangement for balancing excitation of surface acoustic waves in the IDT gaps between the first surface acoustic wave filter section 106 and the second surface acoustic wave filter section 107 is not limited to the arrangement of the surface acoustic wave filter device 101 shown in FIG. 3.

Figure 4:
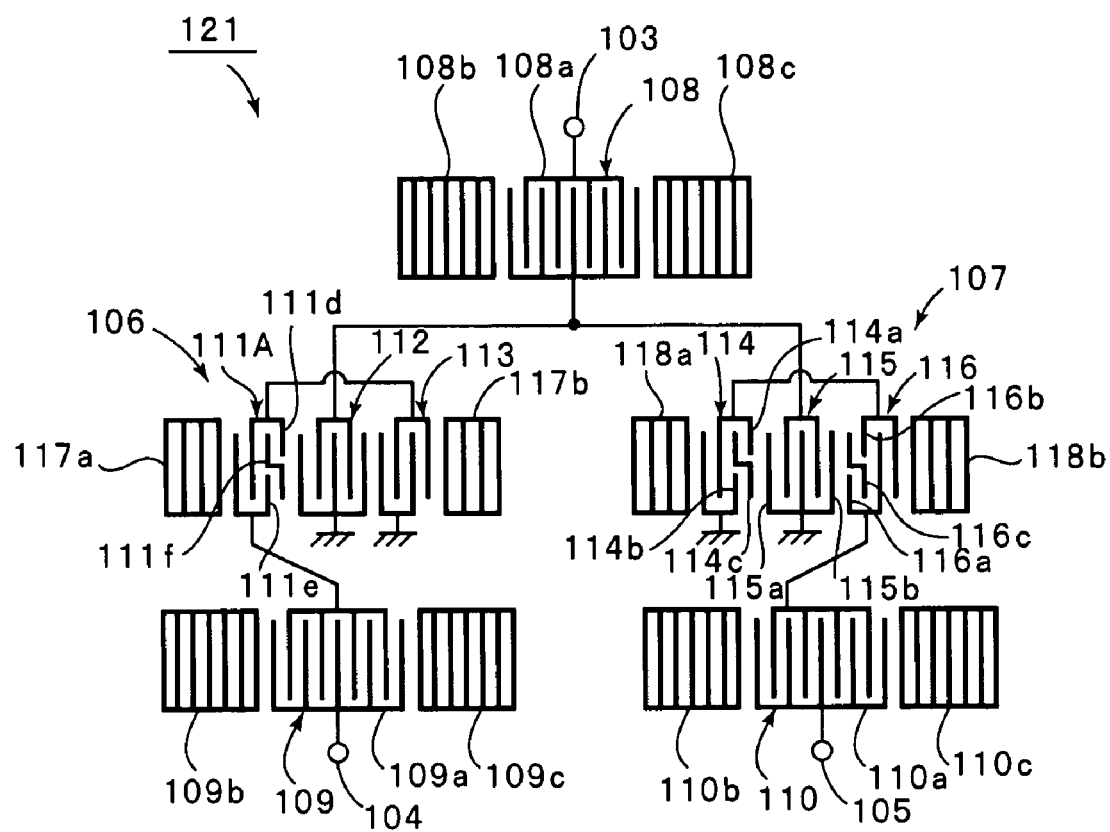
FIG. 4 is a schematic plan view showing an electrode structure of a surface acoustic wave filter device according to a modification of the preferred embodiment shown in FIG. 3.

In a surface acoustic wave filter device 121 according to a modification shown in FIG. 4, series weighting is applied also in the first surface acoustic wave filter section 106 such that a floating electrode finger 111f is provided between an outermost electrode finger 111d and a next electrode finger 111e of an IDT 111A in a gap between the first and second IDTs 111A and 112. Thus, excitation of surface acoustic waves between the IDTs 111A and 112 is minimized. The configuration of the surface acoustic wave filter device 121 is otherwise the same as that of the surface acoustic wave filter device 101.

Also in the surface acoustic wave filter device 121 according to this modification, excitation of surface acoustic waves between the IDTs 114 and 115 and between the IDTs 115 and 116 in the second surface acoustic wave filter section 107 is minimized, so that the state of excitation of surface acoustic waves is similar to that in the gap between the IDTs 111A and 112 and the gap between the IDTs 112 and 113 in the first surface acoustic wave filter section 106. However, according to this modification, excitation of surface acoustic waves in the gap between the first and second IDTs 111A and 112 is also minimized. Thus, the balance between the first surface acoustic wave filter section 106 and the second surface acoustic wave filter section 107 is better in the surface acoustic wave filter device 101 according to the preferred embodiment described above, so that the surface acoustic wave filter device 101 is preferable as compared to the surface acoustic wave filter device 121.

Figure 5:
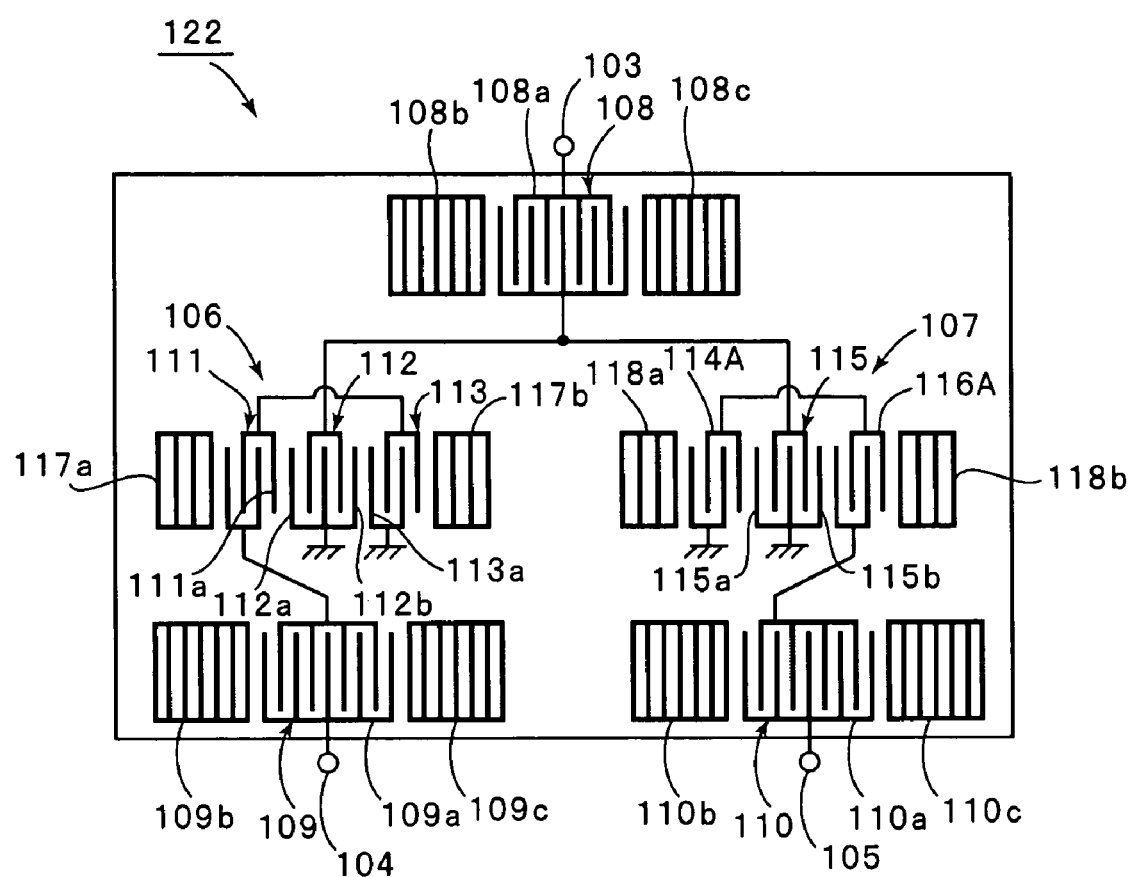
FIG. 5 is a schematic plan view showing an electrode structure of a surface acoustic wave filter device according to another modification of the preferred embodiment shown in FIG. 3.

Although the balance is improved by applying series weighting in the surface acoustic wave filter devices 101 and 121 according to the present preferred embodiment and the modification, series weighting need not necessarily be applied, as in a surface acoustic wave filter device 122 according to a modification shown in FIG. 5. The surface acoustic wave filter device 122 is configured in a similar manner as the surface acoustic wave filter device 101 according to the first preferred embodiment except that series weighting is not applied to IDTs 114A and 116A. Even if series weighting is not applied as described above, the ratio of the impedance on the side of the unbalanced terminal 103 to the impedance on the side of the balanced terminals 104 and 105 can be chosen to be as large as approximately 1:16.

Figure 6:
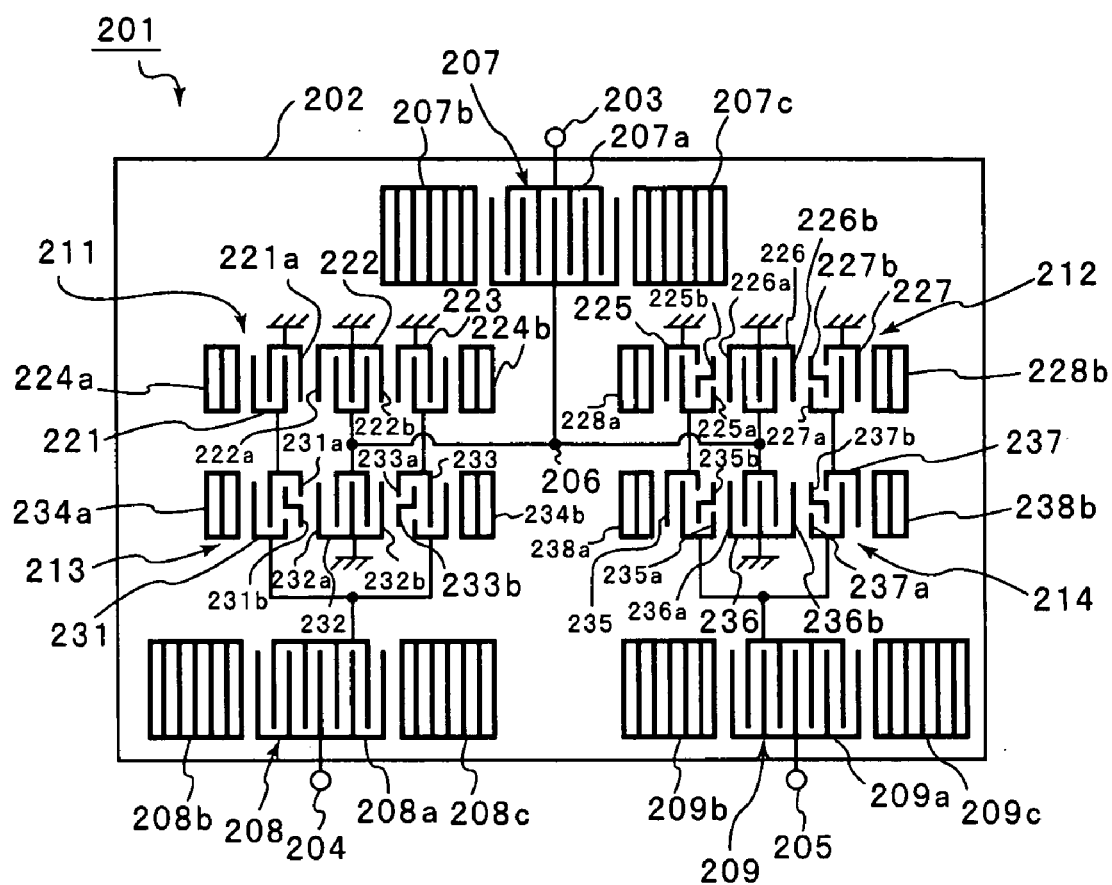
FIG. 6 is a schematic plan view of a surface acoustic wave filter device according to yet another preferred embodiment of the present invention.

FIG. 6 is a schematic plan view of a surface acoustic wave filter device according to yet another preferred embodiment of the present invention. In this preferred embodiment, a surface acoustic wave filter device 201 has an electrode structure shown in FIG. 6, forming a balanced surface acoustic wave filter device 201.

The surface acoustic wave filter device 201 includes a piezoelectric substrate 202. The piezoelectric substrate 202 is composed of a piezoelectric monocrystalline material, such as LiTaO$_3$, LiNbO$_3$, quartz, or a piezoelectric ceramic material. The piezoelectric substrate 202 may be constructed by forming a piezoelectric thin film on a base composed of a piezoelectric material or on an insulating base.

The surface acoustic wave filter device 201 is a balanced surface acoustic wave filter device having a balanced-to-unbalanced conversion function. The surface acoustic wave filter device 201 has an unbalanced terminal 203 and first and second balanced terminals 204 and 205.

On the piezoelectric substrate 202, first to fourth acoustic wave filter elements 211 to 214 are provided. Each of the filter elements 211 to 214 is a surface acoustic wave filter element including three IDTs defined by longitudinally coupled resonators. That is, three IDTs are disposed along the direction of propagation of surface acoustic waves. For example, the first filter element 211 has first to third IDTs 221 to 223 disposed along the direction of propagation of surface acoustic waves. On either side of a region where the IDTs 221 to 223 are provided in the direction of propagation of surface acoustic waves, reflectors 224a and 224b are provided.

Similarly, the second filter element 212 includes first to third IDTs 225 to 227 and reflectors 228a and 228b, the third filter element 213 includes first to third IDTs 231 to 233 and reflectors 234a and 234b, and the fourth filter element 214 includes first to third IDTs 235 to 237 and reflectors 238a and 238b.

According to this preferred embodiment, in the first to fourth filter elements 211 to 214, the second IDTs 222, 226, 232, and 236, each disposed in the middle of three IDTs, are commonly connected to a node 206, which is connected to the unbalanced terminal 203 via a one-port surface acoustic wave resonator 207. That is, the first to fourth filter elements 211 to 214 are connected in parallel to the unbalanced terminal 203.

The one-port surface acoustic wave resonator 207 includes an IDT 207a, and reflectors 207b and 207c disposed on either side of the IDT 207a.

The ends of the IDTs 222, 226, 232, and 236, opposite to the ends thereof connected to the unbalanced terminal 203, are connected to the ground potential.

The phase difference of an output signal relative to an input signal of the first filter element 211 and the phase difference of an output signal relative to an input signal of the second filter element 212 differ by 180 degrees from each other. That is, the polarity of the first filter element 211 and the polarity of the second filter element 212 have an inverted relationship.

The third and fourth filter elements 213 and 214 are configured in substantially the same manner as the first and second filter elements 211 and 212, respectively. That is, the third filter element 213 is configured in substantially the same manner as the first filter element 211 except that series weighting is applied to the third filter element 213. The second and fourth filter elements 212 and 214 are configured in substantially the same manner.

Regarding the first and third IDTs 221 and 223 disposed on either side of the second IDT 222 of the first filter element 211, first ends thereof are connected to the ground potential, and second ends thereof are connected to the first and third IDTs 231 and 233 of the third filter element 213, respectively. The ends of the first and third IDTs 231 and 233, opposite to the ends connected to the IDTs 221 and 223, are commonly connected to the first balanced terminal 204 via a one-port surface acoustic wave resonator 208.

Furthermore, one end of the first IDT 225 and one end of the third IDT 227 of the second filter element 212 are connected to the ground potential. The ends of the first and third IDTs 225 and 227, opposite to the ends connected to the ground potential, are connected to the first and third IDTs 235 and 237 of the fourth filter element 214, respectively. The ends of the IDTs 235 and 237, opposite to the ends connected to the IDTs 225 and 227, are commonly connected to the second balanced terminal 205 via a one-port surface acoustic wave resonator 209.

The one-port surface acoustic wave resonator 208 includes an IDT 208a and reflectors 208b and 208c. Similarly, the one-port surface acoustic wave resonator 209 includes an IDT 209a and reflectors 209b and 209c.

By connecting the IDTs 221 and 223 with the IDTs 231 and 233 as described above, the first and third filter elements 211 and 213 are connected in series with each other between the unbalanced terminal 203 and the first balanced terminal 204. Similarly, by connecting the IDTs 225 and 227 with the IDTs 235 and 237, the second and fourth filter elements 212 and 214 are connected in series with each other between the unbalanced terminal 203 and the second balanced terminal 205.

Furthermore, according to this preferred embodiment, series weighting is applied to electrode fingers including electrode fingers of the IDTs 225 and 227 adjacent to the IDT 226 of the second filter element 212. More specifically, series weighting is applied by providing floating electrode fingers 225b and 227b extending from the proximity of the electrode fingers 225a and 227a of the IDTs 225 and 227 adjacent to the IDT 226 to the proximity of the next electrode fingers.

Also in the fourth filter element 214, similar to the second filter element 212, series weighting is applied to some electrode fingers including the electrode fingers 235a and 237a of the IDTs 235 and 237 adjacent to the IDT 236 by providing floating electrode fingers 235b and 237b.

Also, in the third filter element 213, series weighting is applied to some electrode fingers including the electrode fingers 231a and 233a of the IDTs 231 and 233 adjacent to the IDT 232 by providing floating electrode fingers 231b and 233b.

As described above, in the surface acoustic wave filter device 201 according to this preferred embodiment, the first to fourth filter elements are connected in parallel to the unbalanced terminal 203, the first and third filter elements 211 and 213 are connected in series between the unbalanced terminal 203 and the first balanced terminal 204, and the second and fourth filter elements 212 and 214 are connected in series between the unbalanced terminal 203 and the second balanced terminal 205, whereby a balanced-to-unbalanced conversion function is provided.

Furthermore, denoting the impedance of each of the first to fourth filter elements 211 to 214 as Z, since the filter elements 211 to 214 are connected in parallel as viewed from the unbalanced terminal 203, the impedance on the side of the unbalanced terminal is Z/4. That is, an impedance conversion function by a factor of 4 is achieved by the parallel connection. On the other hand, between the first and second balanced terminals 204 and 205, the first to fourth filter elements 211 to 214 are connected in series. Thus, the impedance on the side of the balanced terminals 204 and 205 is 4Z. Thus, in the surface acoustic wave filter device 201 as a whole, the ratio of the impedance on the side of the unbalanced terminal 203 to the impedance on the side of the balanced terminals 204 and 205 is approximately 1:16. That is, the ratio of impedance conversion is greatly increased.

Therefore, the surface acoustic wave filter device 201 according to this preferred embodiment has a balanced-to-unbalanced conversion function, and also an impedance conversion function by a factor as large as approximately 16.

Furthermore, in the surface acoustic wave filter device 201, the outermost electrode fingers 222a, 222b, 226a, 226b, 232a, 232b, 236a, and 236b of the IDTs 222, 226, 232, and 236 connected to the unbalanced terminal 203 are connected to the ground potential.

In a surface acoustic wave filter device having a balanced-to-unbalanced conversion function, when an electrode finger to which a balanced signal is applied is adjacent to an electrode finger to which an unbalanced signal is applied, a direct wave could occur. This could reduce out-of-band attenuation or deteriorate the balance of balanced signals. According to this preferred embodiment, the outermost electrode fingers of the IDTs 222, 226, 232, and 236 are connected to the ground potential. Thus, electrode fingers to which unbalanced signals are input in the IDTs 222, 226, 232, and 236 are not the outermost electrode fingers of the IDTs 222, 226, 232, and 236. Therefore, electrode fingers to which unbalanced signals are applied are not directly adjacent to the outermost electrode fingers of the IDTs 221, 223, 225, 227, 231, 233, 235, and 237 to which balanced signals are applied. Thus, occurrence of the direct wave is minimized. Accordingly, sufficient out-of-band attenuation is achieved, and the balance is improved.

Furthermore, according to this preferred embodiment, as described above, series weighting is applied to at least some electrode fingers in the regions of the IDTs 225, 227, 231, 233, 235, and 237 adjacent on the sides of the IDTs 226, 232, and 236. The series weighting further improves the balance.

More specifically, of the electrode fingers of the IDTs 221, 223, 225, 227, 231, 233, 235, and 237 connected to the balanced terminal 204 or 205, the outermost electrode fingers adjacent to the IDTs 222, 226, 232, and 236 connected to the unbalanced terminal 203 include electrode fingers connected to the ground potential and electrode fingers to which signals are applied.

Regarding the outermost electrode fingers connected to the ground potential, the outermost electrode fingers of the adjacent IDTs 222, 226, 232, and 236 are also connected to the ground potential. Thus, surface waves are not passively excited in gaps between IDTs. For example, in a region where the IDTs 221 and 222 are adjacent to each other, the outermost electrode finger 221a of the IDT 221 is connected to the ground potential, and the outermost electrode finger 222a of the IDT 222 is also connected to the ground potential. Thus, surface acoustic waves are not passively excited in the gap between the IDTs 221 and 222.

In contrast, surface acoustic waves are passively excited in the gap between the IDTs 225 and 226 of the second filter element 212. That is, a signal is applied to the outermost electrode finger 225a of the IDT 225 on the side of the IDT 226, such that surface acoustic waves are passively excited in the gap between the outermost electrode finger 225a of the IDT 225 and the outermost electrode finger 226a of the IDT 226. Similarly, surface acoustic waves are not passively excited in the gap between the IDTs 222 and 223, but surface acoustic waves are passively excited in the gap between the IDTs 226 and 227. Thus, a difference occurs as to the presence or absence of passive excitation of surface acoustic waves between the first filter element 211 and the second filter element 212, such that the filter symmetry is deteriorated. When the filter symmetry is deteriorated, the balance is also deteriorated.

Thus, according to this preferred embodiment, the series weighting described above is applied so that passive excitation of surface waves in the gap between the IDTs 225 and 226 and the gap between the IDTs 226 and 227 is minimized. That is, series weighting is applied to the IDTs 225 and 227 so as to minimize passive excitation of surface waves in the gap between the IDTs 225 and 226 and the gap between the IDTs 226 and 227.

Accordingly, the symmetry of the surface acoustic wave filter device 201 as a whole is improved, such that the balance is improved.

The one-port surface acoustic wave resonators 207 to 209 need not necessarily be provided.

As described above, in the surface acoustic wave filter device 201, in order to improve the filter symmetry, in the second to fourth filter elements 212 to 214, series weighting is applied so as to minimize passive excitation of surface waves in the gap between the IDTs 225 and 226, the gap between the IDTs 226 and 227, the gap between the IDTs 231 and 232, the gap between the IDTs 232 and 233, the gap between the IDTs 235 and 236, and the gap between the IDTs 236 and 237. Regarding the arrangement for improving the filter symmetry by series weighting, various modifications are possible.

Figure 7:
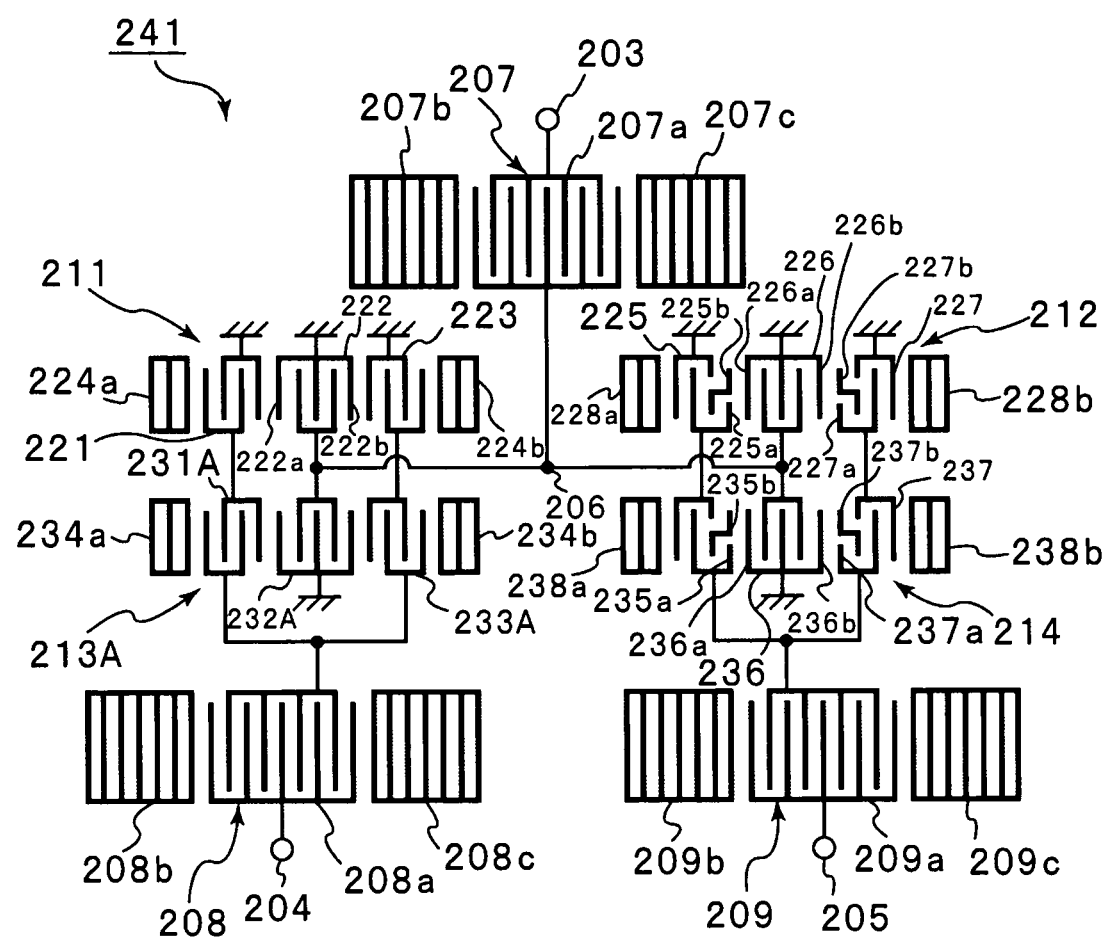
FIG. 7 is a schematic plan view of a surface acoustic wave filter device according to a modification of the preferred embodiment shown in FIG. 6.

For example, a surface acoustic wave filter device 241 according to a modification shown in FIG. 7 is configured in substantially the same manner as the surface acoustic wave filter device 201 except that the series weighting is not applied in a third filter 213A. Also in this case, the filter symmetry is improved in a region where the first and second filter elements 211 and 212 are provided. Thus, also in this modification, the symmetry of the filter as a whole is improved.

Figure 8:
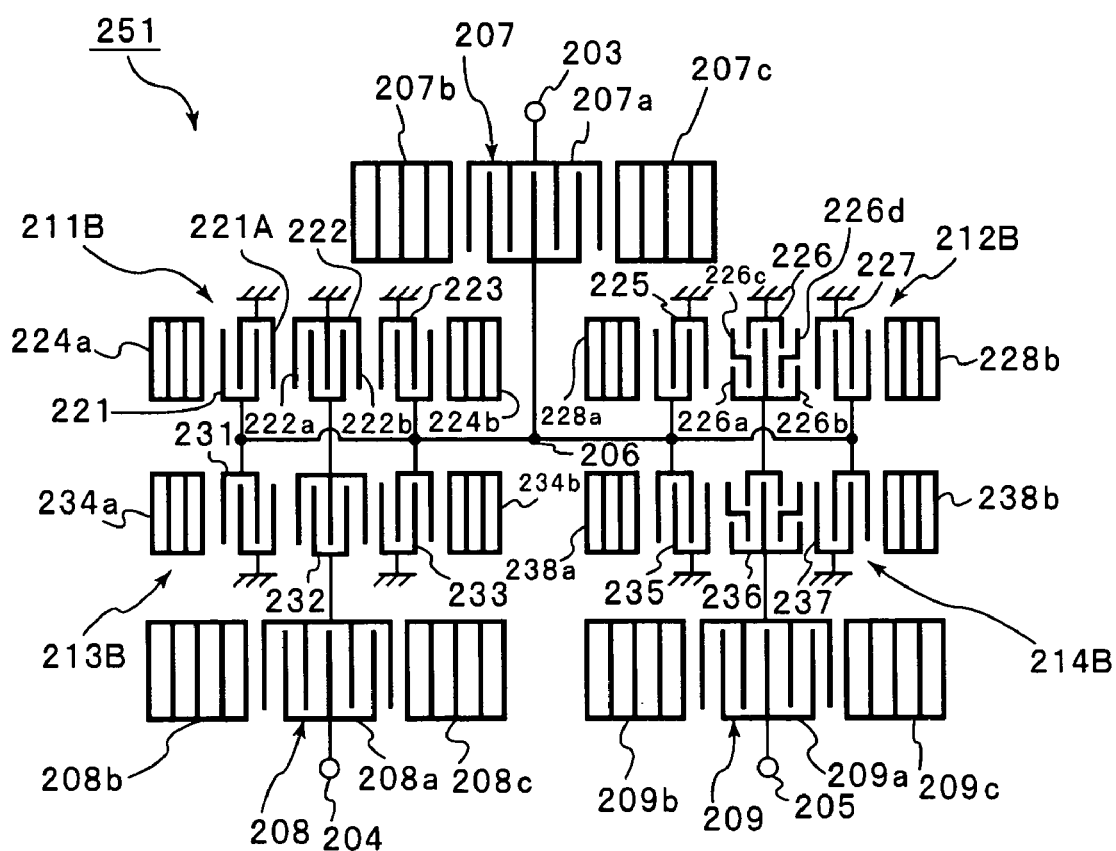
FIG. 8 is a schematic plan view of a surface acoustic wave filter device according to still another preferred embodiment of the present invention.

FIG. 8 is a schematic plan view showing an electrode structure of a surface acoustic wave filter device according to yet another preferred embodiment of the present invention. In a surface acoustic wave filter device 251 according to this preferred embodiment, the electrode structure of first to fourth filter elements 211B to 214B is substantially the same as that in the modification shown in FIG. 7 except for the portion where series weighting is applied. Thus, the same parts are designated by the same reference numerals, and descriptions thereof is omitted.

In this preferred embodiment, one end of each of the first and third IDTs 221, 223, 225, 227, 231, 233, 235, and 237 of the first to fourth filter elements 211B to 214B is connected a node 206, and is connected to the unbalanced terminal 203 via the one-port surface acoustic wave resonator 207. The other ends of the IDTs 221, 223, 225, 227, 231, 233, 235, and 237 are connected to the ground potential. Thus, the first to fourth filter elements 211B to 214B are connected in parallel to the unbalanced terminal 203.

Furthermore, one end of the second IDT 222 of the first filter element 211B is connected to the ground potential, and the other end thereof is connected to one end of the corresponding second IDT 232 of the third filter element 213B. The other end of the second IDT 232 is connected to the first balanced terminal via the one-port surface acoustic wave resonator 208.

Similarly, one end of the second IDT 226 of the second filter element 212B is connected to the ground potential, and the other end thereof is connected to one end of the corresponding second IDT 236 of the fourth filter element 214B. The other end of the IDT 236 is connected to the second balanced terminal 205 via the one-port surface acoustic wave resonator 209.

Thus, also in this preferred embodiment, the first filter element 211B and the third filter element 213B are connected in series with each other, and the second filter element 212B and the fourth filter element 214B are connected in series with each other.

As described above, as in this preferred embodiment, the first and third IDTs 221, 223, 225, 227, 231, 233, 235, and 237 of the first to fourth filter elements 211B to 214B may be connected to the unbalanced terminal 203, and the second IDTs 232 and 236 in the middle of the third and fourth filter elements 213B and 214B may be connected to the first and second balanced terminals 204 and 205, respectively.

Also in this preferred embodiment, of the IDTs 221, 223, 225, 227, 231, 233, 235, and 237, electrode fingers adjacent to IDTs connected to the balanced terminal 204 or 205 are all connected to the ground potential. More specifically, the electrode finger 221A of the IDT 221, adjacent to the IDT 222 connected to a balanced terminal, is connected to the ground potential. As described above, of the electrode fingers of the IDTs connected to the unbalanced terminals, electrode fingers adjacent to IDTs connected to a balanced terminal are all connected to the ground potential. Thus, similarly to the preferred embodiment shown in FIG. 6, the occurrence of a direct wave is minimized, so that the sharpness of out-of-band attenuation is improved and the balance is improved.

Furthermore, also in this preferred embodiment, series weighting is applied so that balance is improved. That is, in the second IDT 226 in the middle of the second filter element 212B, series weighting is applied to some electrode fingers including electrode fingers adjacent to the IDTs 225 and 227. More specifically, series weighting is applied such that floating electrode fingers 226c and 226d are provided between outermost electrode fingers 226a and 226b and next electrode fingers of the IDT 226 in the direction of propagation of surface waves. On the other hand, series weighting is not applied in the IDTs 225 and 227. Also in this case, passive excitation is minimized in the gap between the IDTs 225 and 226 and the gap between the IDTs 226 and 227 by the series weighting.

In the surface acoustic wave filter device 251, series weighting is similarly applied to the second IDT 236 in the fourth filter element 214B, and series weighting is not applied to the first and third IDTs 235 and 237 on either side thereof.

Each of the first to fourth filter elements 211 to 214 may alternatively be a surface acoustic wave filter element including five IDTs each defined by longitudinally coupled resonators.

Figure 9:
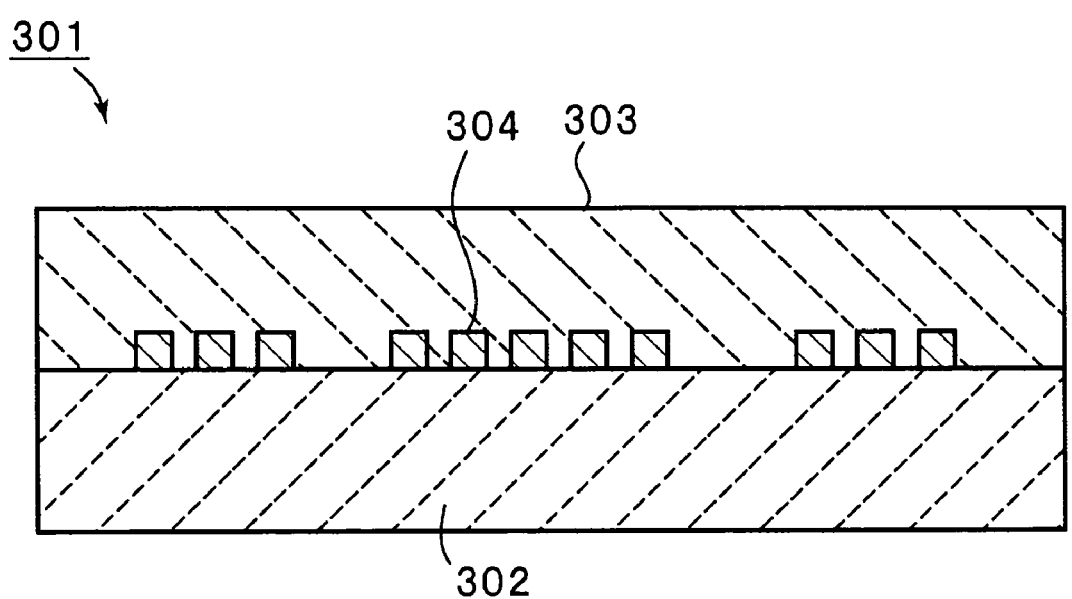
FIG. 9 is a schematic front sectional view of a boundary acoustic wave device to which the present invention can be applied.
Figure 10:
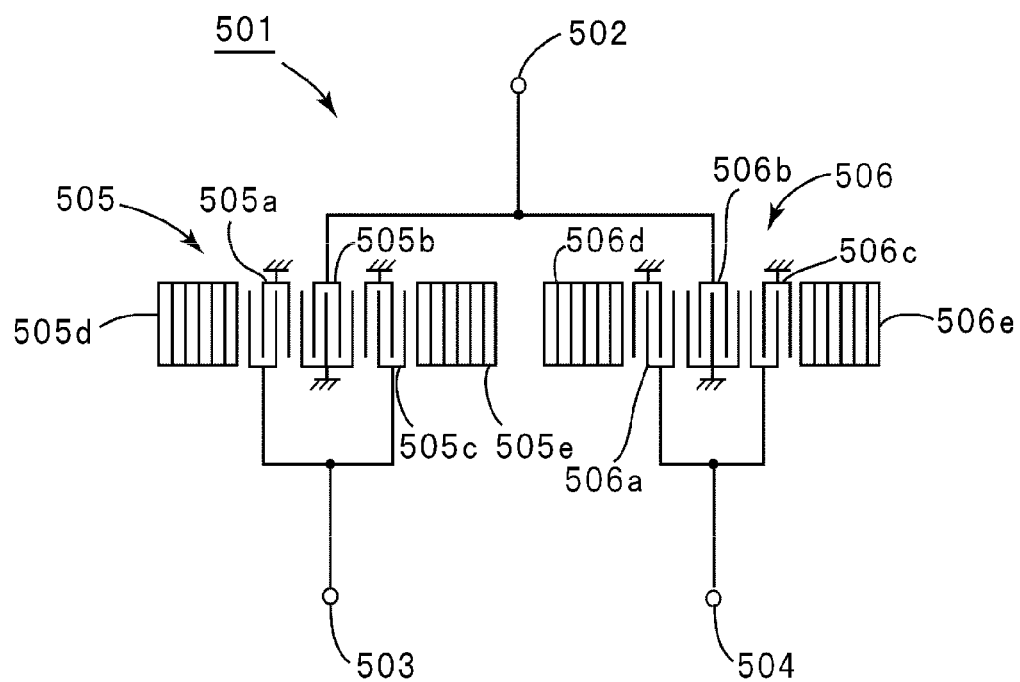
FIG. 10 is a schematic plan view of a balanced surface acoustic wave filter device according to the related art.

Although the acoustic wave filter devices according to the preferred embodiments and modifications described above use surface acoustic waves as described above, alternatively, other types of acoustic waves may be used, such as boundary acoustic waves. FIG. 9 is a front sectional view schematically showing the configuration of a boundary acoustic wave filter device. A boundary acoustic wave filter device 301 includes a lamination of a piezoelectric substrate 302 as a first medium layer and a dielectric layer 303 as a second medium layer. Electrodes 304 including a plurality of IDTs are arranged at the boundary between the piezoelectric substrate 302 and the dielectric layer 303. Filter characteristics are achieved using boundary acoustic waves propagating at the boundary. In this case, acoustic wave filter devices can be constructed by arranging the structure of the electrodes 304 of the boundary acoustic wave filter device 301 similarly to the electrode structures according to the preferred embodiments of the surface acoustic wave filter devices described above.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A balanced acoustic wave filter device comprising:
   an unbalanced terminal and first and second balanced terminals;
   a piezoelectric substrate; and
   first and second acoustic wave filter sections arranged on the piezoelectric substrate, the first and second acoustic wave filter sections each including at least three interdigital transducers defined by longitudinally coupled resonators; wherein
   the first acoustic wave filter section includes a first interdigital transducer, a second interdigital transducer, and a third interdigital transducer; the second interdigital transducer being connected to the first balanced terminal, and the first and third interdigital transducers being disposed on either side of the second interdigital transducer;
   the second acoustic wave filter section includes a fourth interdigital transducer, a fifth interdigital transducer, and a sixth interdigital transducer; the fifth interdigital transducer being connected to the second balanced terminal, and the fourth and sixth interdigital transducers being disposed on either side of the fifth interdigital transducer;
   the first to sixth interdigital transducers are arranged so that an electric signal that flows through the first balanced terminal and an electric signal that flows through the second balanced terminal have phases different by 180 degrees; and
   the second interdigital transducer of the first acoustic wave filter section and the fifth interdigital transducer of the second acoustic wave filter section each have first and second interdigital transducer bus bar segments divided in the direction of propagation of acoustic waves, the first and second interdigital transducer segments being electrically connected in series with each other.

2. The balanced acoustic wave filter device according to claim 1, wherein outermost electrode fingers on either side of the second interdigital transducer are connected to a portion of the second interdigital transducer which electrically connects the first and second interdigital transducer segments in series in the second interdigital transducer, and wherein outermost electrode fingers on either side of the fifth interdigital transducer are connected to a portion of the fifth interdigital transducer which electrically connects the first and second interdigital transducer segments in series in the fifth interdigital transducer.

3. The balanced acoustic wave filter device according to claim 1, wherein outermost electrode fingers on either side of the second interdigital transducer are not connected to a portion of the second interdigital transducer which electrically connects the first and second interdigital transducer segments in series in the second interdigital transducer, and wherein outermost electrode fingers on either side of the fifth interdigital transducer are not connected to a portion of the fifth interdigital transducer which electrically connects the first and second interdigital transducer segments in series in the fifth interdigital transducer.

4. The balanced acoustic wave filter device according to claim 1, wherein an impedance ratio of the unbalanced terminal to the first and second balanced terminals is approximately 1:16.

5. The balanced acoustic wave filter device according to claim 1, wherein the balanced acoustic wave filter device is a surface acoustic wave filter device that uses surface acoustic waves.

6. The balanced acoustic wave filter device according to claim 1, wherein the balanced acoustic wave filter device is a boundary acoustic wave filter device that uses boundary acoustic waves.

7. A balanced acoustic wave filter device comprising:
   an unbalanced terminal and first and second balanced terminals;
   a piezoelectric substrate; and
   first and second acoustic wave filter sections arranged on the piezoelectric substrate, the first and second acoustic wave filter sections each including at least three interdigital transducers defined by longitudinally coupled resonators; wherein
   the first acoustic wave filter section includes first to third interdigital transducers disposed along a direction of propagation of acoustic waves, and the second acoustic wave filter section includes fourth to sixth interdigital transducers disposed along the direction of propagation of acoustic waves;
   the first to sixth interdigital transducers are arranged so that a phase difference of an output signal relative to an input signal in the first acoustic wave filter section and a phase difference of an output signal relative to an input signal in the second acoustic wave filter section differ by 180 degrees;
   the second and fifth interdigital transducers are connected to the unbalanced terminal;

one end of the first interdigital transducer and one end of the third interdigital transducer are connected to each other such that the first and third interdigital transducers are connected in series with each other;

the other end of the first interdigital transducer is connected to the first balanced terminal;

the other end of the third interdigital transducer is connected to a ground potential;

one end of the fourth interdigital transducer and one end of the sixth interdigital transducer are connected to each other such that the fourth and sixth interdigital transducers are connected in series with each other;

the other end of the fourth interdigital transducer is connected to the second balanced terminal; and the other end of the sixth interdigital transducer is connected to a ground potential.

8. The balanced acoustic wave filter device according to claim 7, wherein outermost electrode fingers of the second and fifth interdigital transducers are connected to a ground potential.

9. The balanced acoustic wave filter device according to claim 8, wherein series weighting is applied to an outermost electrode finger in at least one of the first, third, fourth, and sixth interdigital transducers that is adjacent to an outermost electrode finger of the second or fifth interdigital transducer.

10. The balanced acoustic wave filter device according to claim 9, wherein the series weighting includes a floating electrode finger provided between the outermost electrode finger and an adjacent electrode finger in at least one of the first, third, fourth, and sixth interdigital transducers.

11. The balanced acoustic wave filter device according to claim 7, wherein an impedance ratio of the unbalanced terminal to the first and second balanced terminals is approximately 1:16.

12. The balanced acoustic wave filter device according to claim 7, wherein the balanced acoustic wave filter device is a surface acoustic wave filter device that uses surface acoustic waves.

13. The balanced acoustic wave filter device according to claim 7, wherein the balanced acoustic wave filter device is a boundary acoustic wave filter device that uses boundary acoustic waves.

14. A balanced acoustic wave filter device comprising:
a first filter element including interdigital transducers defined by longitudinally coupled resonators;
a second filter element including interdigital transducers defined by longitudinally coupled resonators, a phase difference of an output signal relative to an input signal in the second filter element differing by 180 degrees from a phase difference of an output signal relative to an input signal in the first filter element;
a third filter element including interdigital transducers defined by longitudinally coupled resonators; and
a fourth filter element including interdigital transducers defined by longitudinally coupled resonators, a phase difference of an output signal relative to an input signal in the fourth filter element differing by 180 degrees from a phase difference of an output signal relative to an input signal in the third filter element; wherein the first to fourth filter elements are connected to an unbalanced terminal, and interdigital transducers of the first to fourth filter elements connected to the unbalanced terminal are connected in parallel;

the third filter element is connected to a first balanced terminal and the fourth filter element is connected to a second balanced terminal;

an interdigital transducer connected to the first balanced terminal of the third filter element is connected in series with a corresponding interdigital transducer of the first filter element; and an interdigital transducer connected to the second balanced terminal of the fourth filter element is connected in series with a corresponding interdigital transducer in the second filter element.

15. The balanced acoustic wave filter device according to claim 14, wherein electrode fingers of the interdigital transducers connected to the unbalanced terminal, that are adjacent to interdigital transducers connected to the first or second balanced terminal, are connected to a ground potential.

16. The balanced acoustic wave filter device according to claim 15, wherein series weighting is applied to at least one electrode finger of the interdigital transducers connected to the first or second balanced terminal that is adjacent to the interdigital transducer connected to the unbalanced terminal, the at least one electrode finger being an electrode finger not connected to ground potential.

17. The balanced acoustic wave filter device according to claim 16, wherein the series weighting includes a floating electrode finger provided between the at least one electrode finger and an adjacent electrode finger of the interdigital transducers connected to the first or second balanced terminal.

18. The balanced acoustic wave filter device according to claim 14, wherein an impedance ratio of the unbalanced terminal to the first and second balanced terminals is approximately 1:16.

19. The balanced acoustic wave filter device according to claim 14, wherein the balanced acoustic wave filter device is a surface acoustic wave filter device that uses surface acoustic waves.

20. The balanced acoustic wave filter device according to claim 14, wherein the balanced acoustic wave filter device is a boundary acoustic wave filter device that uses boundary acoustic waves.

* * * * *